United States Patent
Pye et al.

(10) Patent No.: US 9,172,353 B2
(45) Date of Patent: Oct. 27, 2015

(54) PROGRAMMABLE FILTER

(71) Applicant: ANALOG DEVICES, INC., Norwood, MA (US)

(72) Inventors: Andrew Pye, Somerville, MA (US); Marc E. Goldfarb, Atkinson, NH (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/050,181

(22) Filed: Oct. 9, 2013

(65) Prior Publication Data
US 2015/0097637 A1    Apr. 9, 2015

(51) Int. Cl.
| | |
|---|---|
| *H03H 7/00* | (2006.01) |
| *H03B 1/00* | (2006.01) |
| *H03K 5/00* | (2006.01) |
| *H03H 11/04* | (2006.01) |
| *H01F 27/28* | (2006.01) |
| *H03H 7/01* | (2006.01) |
| *H03H 7/09* | (2006.01) |

(52) U.S. Cl.
CPC ........... *H03H 11/04* (2013.01); *H01F 27/2804* (2013.01); *H03H 7/01* (2013.01); *H03H 7/0153* (2013.01); *H03H 7/09* (2013.01)

(58) Field of Classification Search
CPC ..... H03H 7/00; H03H 7/0115; H03H 7/0153; H03H 7/1775; H03H 11/04
USPC .......................................................... 333/174
See application file for complete search history.

(56) References Cited

U.S. PATENT DOCUMENTS

| | | | |
|---|---|---|---|
| 5,021,758 | A | 6/1991 | Lane |
| 5,148,062 | A | 9/1992 | Goldfarb |
| 6,549,096 | B2 | 4/2003 | Groves et al. |
| 7,259,643 | B2 * | 8/2007 | Son et al. ...................... 333/174 |
| 7,432,794 | B2 | 10/2008 | Mattsson |
| 7,460,001 | B2 | 12/2008 | Jessie |
| 7,808,752 | B2 | 10/2010 | Richiuso et al. |
| 8,018,312 | B2 | 9/2011 | Kossel et al. |
| 8,102,232 | B2 | 1/2012 | Yan et al. |
| 8,390,386 | B2 | 3/2013 | Tanabe |
| 2003/0025563 | A1 | 2/2003 | Christensen |
| 2006/0033602 | A1 | 2/2006 | Mattsson |
| 2012/0223796 | A1 | 9/2012 | Huang et al. |

FOREIGN PATENT DOCUMENTS

DE    10-2014-111197    4/2015

OTHER PUBLICATIONS

Seong-Mo Yim et al., "Demonstration of a Switched Resonator Concept in a Dual-Band Monolithic CMOS LC-Tuned VCO," 0-7803-6591-7/01 © 2001 IEEE, IEEE 2001 Custom Integrated Circuits Conference, pp. 205-208.

* cited by examiner

*Primary Examiner* — Hai L Nguyen
(74) *Attorney, Agent, or Firm* — Patent Capital Group

(57) ABSTRACT

In one example embodiment, a programmable filter is provided, including a plurality of variable-inductance networks and a plurality of variable-capacitance networks. The programmable filter may be implemented in a classical filter topology, with variable-capacitance networks replacing discrete capacitors and variable-inductance networks replacing discrete inductors. An example variable-inductance network comprises a primary inductor with an intermediate tap, and secondary inductor connected at the intermediate tap, with switches for selecting an inductance.

19 Claims, 4 Drawing Sheets

PROGRAMMABLE FILTER

TECHNICAL FIELD

This application relates to the field of signal filtering, and more particularly to a programmable filter.

BACKGROUND

In electronics design, the reactive impedance of inductors and capacitors are used to form filters, including low-pass filters, high-pass filters, bandpass filters, and bandstop filters. The cutoff frequency for a low-pass or high-pass filter, pass band for a bandpass filter, and stop band for a bandstop filter, are dependent on the values of capacitors and inductors chosen according to principles well-known in the art. Filters do not, however, provide perfect linear cutoffs at their pass bands, stop bands, and cutoff frequencies. Rather, they provide a rolloff rate that is characterized in terms of decibels per decade on a logarithmic scale. For example, the characteristic rolloff for a first-order filter is generally on the order of −20 dB/decade. The rolloff rate can be substantially increased by adding additional stages to the filter to form a higher-order filter. For example, a fifth-order filter may achieve a rolloff rate on the order of −100 dB/decade.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

DETAILED DESCRIPTION OF THE EMBODIMENTS

Overview

Figure 1:
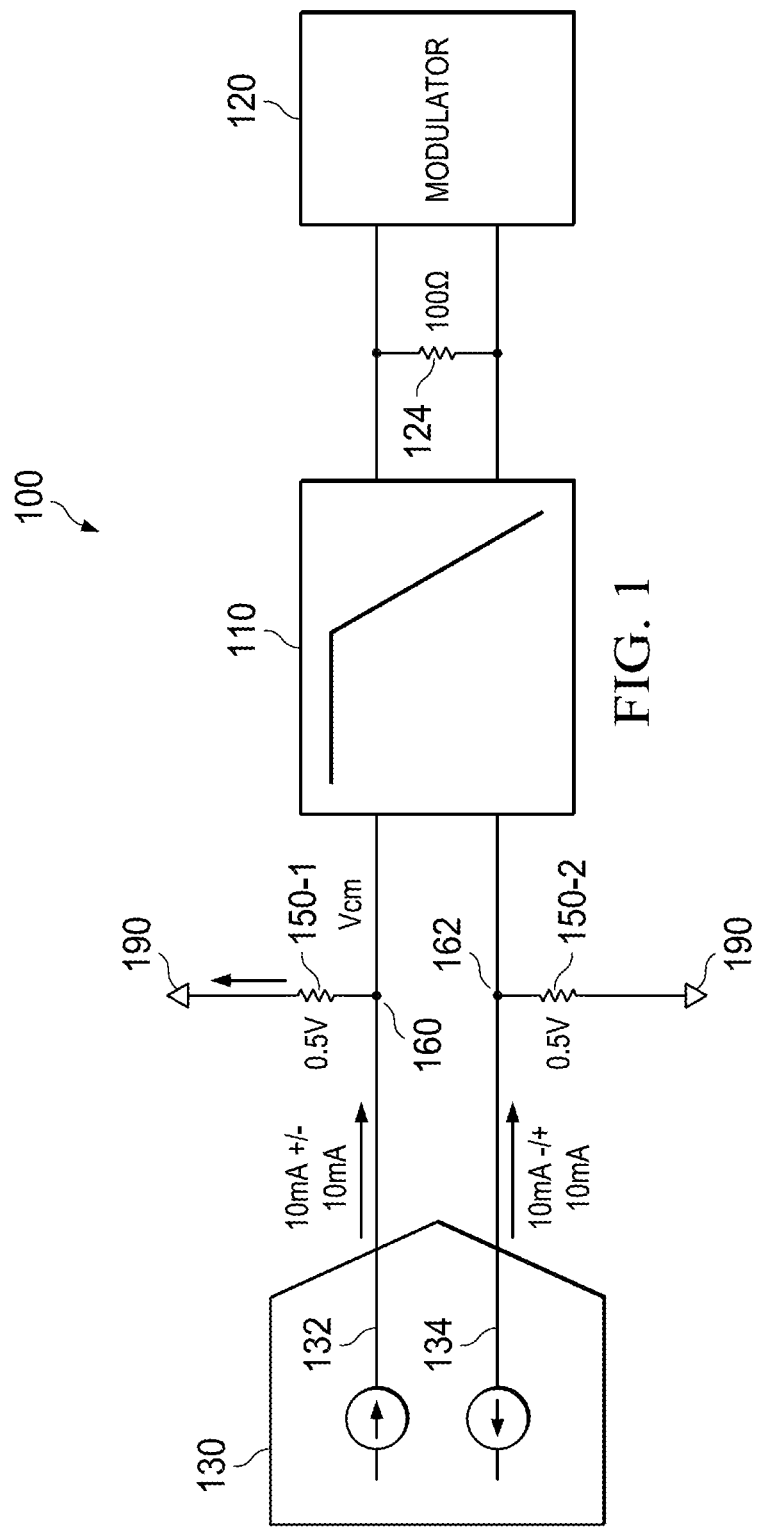
FIG. 1 is a block diagram of an example integrated circuit including a programmable filter.

In one example embodiment, there is disclosed a variable inductor comprising a primary inductor having a first terminal, a second terminal, and an intermediate tap; a secondary inductor having a first terminal connected to the intermediate tap of the primary inductor, and a second terminal; a first switch connected between the first terminal of the primary inductor and the second terminal of the secondary inductor; and a second switch connected between the second terminal of the primary inductor and the second terminal of the secondary inductor; whereby the total inductance can be varied by opening one or both switches and the variable inductor can be bypassed by closing both switches.

In another example embodiment, there is disclosed a programmable filter comprising a variable-capacitance network comprising a plurality of capacitors and a capacitance switch for selecting between at least two available capacitances; a variable-inductance network comprising a plurality of inductors and an inductance switch for selecting between at least two available inductances; whereby a passband is selectable by selecting an available capacitance and an available inductance.

In yet another example embodiment, there is disclosed an integrated circuit element comprising a first conductive winding on a first layer in a first direction, the first winding having an intermediate tap; a second conductive winding on a second layer in a second direction, a terminal of the second winding being electrically connected to the intermediate tap.

DESCRIPTION OF THE EXAMPLE EMBODIMENTS

The following disclosure provides many different embodiments, or examples, for implementing different features of the present disclosure. Specific examples of components and arrangements are described below to simplify the present disclosure. These are, of course, merely examples and are not intended to be limiting. Further, the present disclosure may repeat reference numerals and/or letters in the various examples. This repetition is for the purpose of simplicity and clarity and does not in itself dictate a relationship between the various embodiments and/or configurations discussed. Different embodiments many have different advantages, and no particular advantage is necessarily required of any embodiment.

In an example embodiment, this specification discloses a filter with a programmable passband. Programmability is realized by providing a network of variable capacitors and variable inductors. The variable inductors may be built as part of an integrated circuit, and may comprise a plurality of inductors of a known inductance in a wye-configuration. Solid state switches may be provided to optionally bypass certain of the inductors, or change their mutual inductance. In one example with three inductors controlled by two switches, each variable inductor is provided with three discrete inductances and a bypass mode. This configuration can be realized in silicon by providing, for example, a primary winding with multiple coils and a relatively narrow trace line, and a secondary winding at an intermediate tap of the primary winding, the secondary winding being wider and having only one winding.

FIG. 1 is a block diagram of an example integrated circuit (IC) 100, which is only one of many types of circuits that can be built according to the present specification. IC 100 includes a digital-to-analog converter (DAC) 130, which is configured to receive a digital input signal and output a corresponding analog signal. In an example embodiment, DAC 130 provides an analog output signal 132 to modulator 120, which may be for example part of a communication circuit.

In example integrated circuit 100, modulator 120 does not generate any DC current, but rather presents a high-impedance load. A differential resistor 124 is placed across the input terminals for filter termination, but does not affect the DC current. Thus, the current through resistor 150-1 is solely produced by the DC (mid-range) current 132 from DAC 130, in this example case 10 mA through son resistor 150-1, yielding 0.5V across resistor 150-1, flowing into ground 190.

DAC 130 generates a complementary output current 132, 134 between 0 mA and 20 mA, with a common mode (midrange) of 10 mA. This common mode current generates a common-mode voltage Vcm through series resistors 150. In this case, the 10 mA current through 50Ω resistors 150 generates a common-mode voltage of 0.5 V. Modulator 120 presents a high-impedance input, so that differential resistor 124 terminates the output of filter 110 without affecting DC current or voltage.

In some cases, it is desirable to provide programmable low-pass filter 110 with a plurality of selectable pass bands. For example, in this embodiment, programmable cutoff frequencies can be used in the case where DAC 130 has selectable sample rates for different signal bandwidths in communications or other similar applications.

Figure 2:
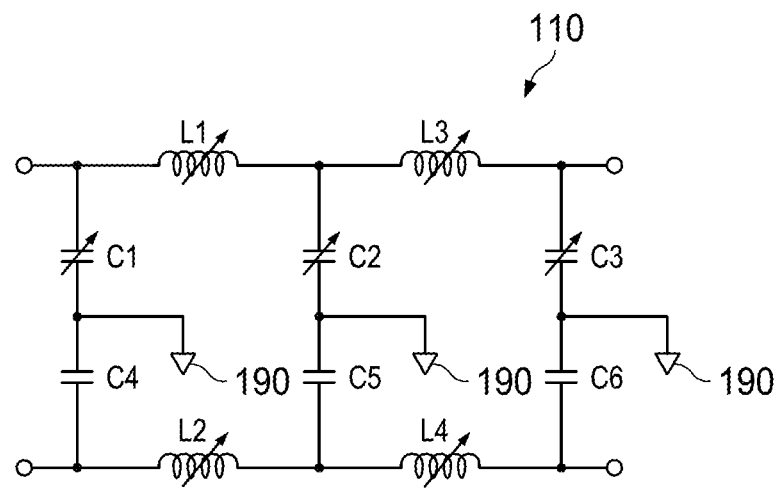
FIG. 2 is an electrical schematic of a differential fifth-order programmable filter with variable inductors and capacitors.

FIG. 2 is an electrical schematic of an example embodiment of a differential programmable low-pass filter 110. It should be recognized that although a low-pass filter is disclosed as an example embodiment, similar techniques can be used to design other types of filters such as high-pass filters, bandpass filters, and bandstop filters. In this embodiment, programmable low-pass filter 110 provides a fifth-order low-pass filter with a classical balanced ladder topology, except that capacitors C1, C2, C3, C4, C5, and C6, along with inductors L1, L2, L3, and L4 may all be variable. In this example embodiment, variable capacitors C and variable inductors L are discretely rather than continuously variable, with discrete values being controlled by switches, as further disclosed in FIGS. 3 and 4. In one example embodiment, C1 and C4 are coupled to a common control so that they have an equivalent value, as is described in more detail below. Similarly, C2 may be coupled to C5, and C3 may be coupled to C6.

Figure 3:
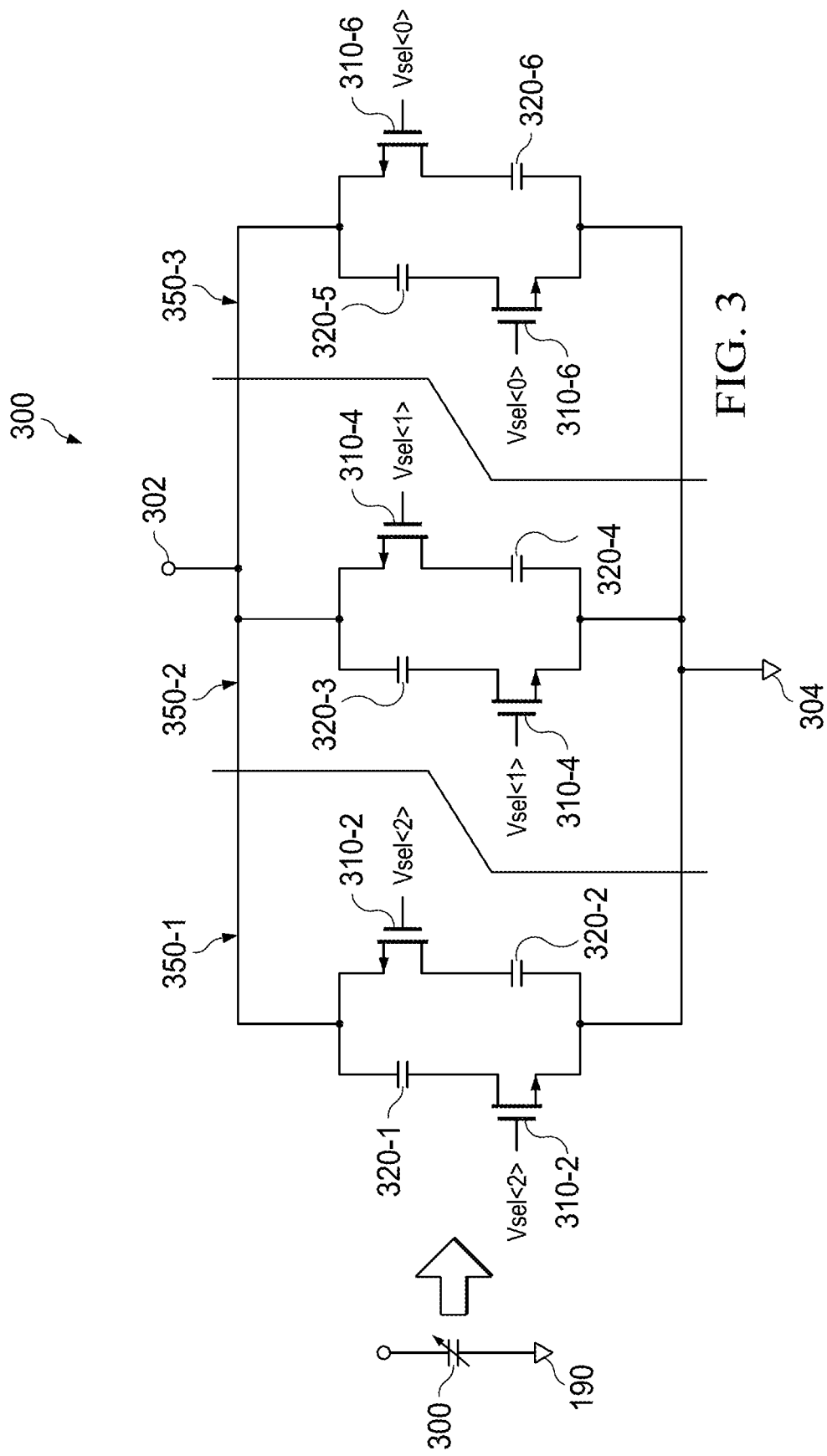
FIG. 3 is an electrical schematic of an example variable-capacitance network.

FIG. 3 is an electrical schematic of an example embodiment of a variable-capacitance network 300, which in some embodiments may be used for each variable capacitor C of FIG. 2. Variable-capacitance network 300 includes a positive terminal 302 and a negative terminal 304, the designation of "positive" and "negative" being arbitrary for bi-directional capacitors. In cases where directional capacitors, such as electrolytic capacitors, are used, the designations of "positive" and "negative" may be prescriptive. Furthermore, although input terminal 302 is shown by convention as a "signal" voltage and output terminal 304 is shown by convention as a "ground" terminal, any two suitable terminals that provide a difference in potential may be used.

It should be noted that although this example circuit is disclosed in a single-ended configuration, a differential configuration can be trivially substituted.

This embodiment includes three discrete stages 350. First stage 350-1 includes two capacitors 320-1, 320-2 and two select switches 310-1, 310-2. In this embodiment, select switches 310 are solid-state electronic switches such as MOSFETs, which may be implemented as part of an integrated circuit. It should be noted, however, that select switches 310 may be other types of switches in other embodiments, including microelectromechanical switches, electromechanical relays, or manual mechanical switches. Also in this embodiment, switches 310 are functionally paired, so that both are either selected or not selected, for example because they receive a common input. This may be done, for example, to maintain symmetric layout in an integrated circuit. It should be recognized, however, that additional granularity of capacitance control can be realized by making select switches 320 independently selectable.

In this embodiment, when paired select switches 310-1, 310-2 are open, first stage 350-1 is bypassed. When paired select switches 310-1, 310-2 are closed, first stage 350-1 provides a capacitance equal to the sum of capacitors 320-1 and 320-2.

Similarly, second stage 350-2 is controlled by paired select switches 310-3, 310-4, which when open bypass second stage 350-2, and when closed provide a capacitance equal to the sum of capacitors 320-3 and 320-4. Third stage 350-3 is controlled by paired select switches 310-5, 310-6, which when open bypass third stage 350-3 and when closed provide a capacitance equal to the sum of capacitors 320-5 and 320-6.

Thus, manipulation of the three select switch pairs provides up to seven discrete operating capacitances plus a bypass mode ("000" when all three select switch pairs are open). If, on the other hand, select switches 310 are encoded in a monotonic Gray code (000,001,011,111), then up to three discrete operating capacitances plus a bypass mode are provided. If completely independent select switches 310 are provided, then up to 31 operating capacitances plus a bypass mode are provided, or up to five operating capacitances and a bypass mode for monotonic Gray code. In each case, the total capacitance provided by variable-capacitance network 300 is the linear sum of all non-bypassed capacitors 320. It should be recognized that other arrangements are also possible, in which case total capacitance may be governed by a relationship other than linear sum, according to methods well-known in the art.

Figure 4:
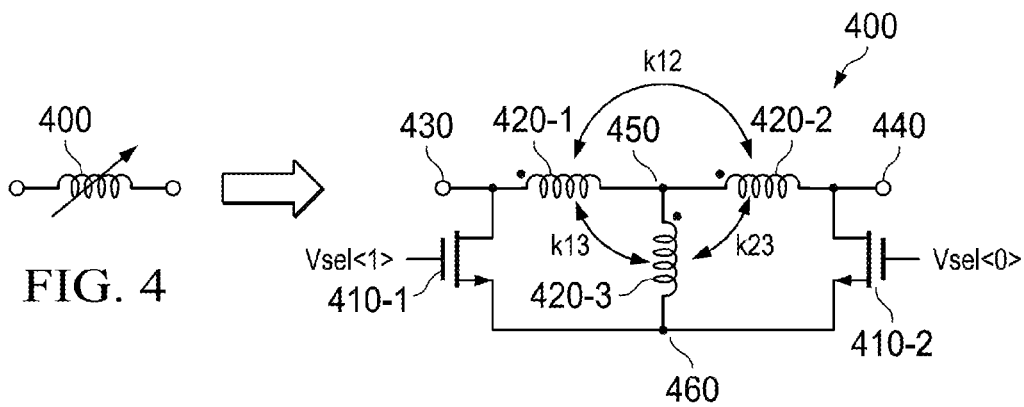
FIGS. 4-4E are electrical schematics of an example variable-inductance network in various states.

FIG. 4 is an electrical schematic of an example embodiment of a variable-inductance network 400, which in some embodiments may be used for each variable inductor L of FIG. 2. Variable-inductance network 400 includes three inductors 420, controlled by select switches 410, which may be of the same species as select switches 310 (FIG. 3). In this embodiment, first inductor 420-1 is placed in series with second inductor 420-2, and positive node 430 and negative node 440 are shown. It should be recognized that "positive" node and "negative" node may be arbitrary designations for a generic inductor, but may be prescriptive for certain arrangements of inductors where specific electromagnetic properties are desired.

First inductor 420-1 and second inductor 420-2 join at an intermediate tap 450. Intermediate tap 450 may represent a connection at which terminals of two discrete inductors are joined, or it may represent a "true" center or intermediate tap of a single inductor, wherein first inductor 420-1 and second inductor 420-2 are formed of a single conductive winding that is "tapped" at some intermediate point, which may or may not be the mathematical or geometric center of the winding, wherein a conductor may be electrically connected to the intermediate tap to provide a conductive route to other circuit elements. A third inductor 420-3, sometimes referred to as a secondary or auxiliary inductor, also has one terminal joined to intermediate tap 450, with its second terminal at node 460. First select switch 410-1 is connected between input node 430 and node 460, while second select switch 410-2 is connected between output node 440 and node 460.

Figure 4A:
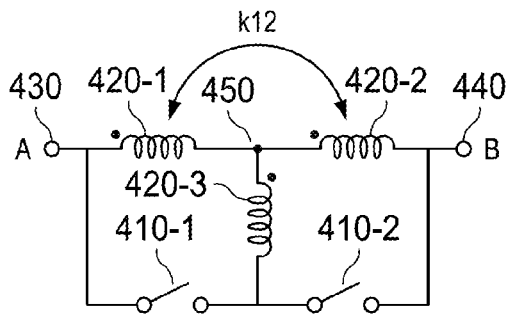
Figure 4B:
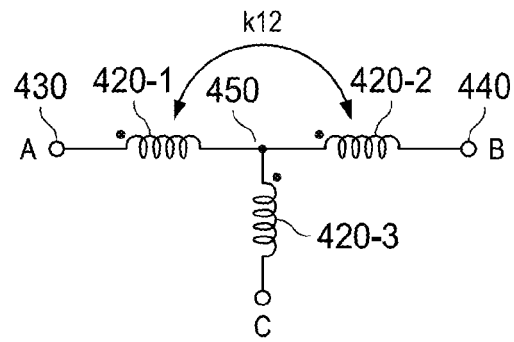

FIG. 4A provides an alternative embodiment with select switches 410 shown as mechanical switches. It should be recognized that numerous other types of switches may be used. FIG. 4B discloses the equivalent circuit of variable-inductance network 400 when both select switches 410 are open. In this case, third inductor 420-3 is "floating," and therefore does not contribute its inductance to the network. In this case, the total inductance of the network is the linear sum of inductors 420-1 and 420-2, plus any mutual inductance between the two, as designated by the dot markings.

Figure 4C:
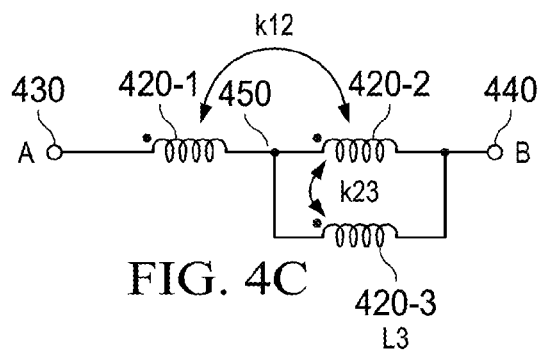

FIG. 4C discloses the equivalent circuit of variable-inductance network 400 when first select switch 410-1 is open and second select switch 410-2 is closed. In this case, third inductor 420-3 lies parallel to second inductor 420-2 and in series with first inductor 420-1. In this case, the total inductance of the network can be described with the following equation:

$$L_{eq1} = L_{nom} - \frac{(L_2 + k_{12}\sqrt{L_1 L_2} - k_{13}\sqrt{L_1 L_3} - k_{23}\sqrt{L_2 L_3})^2}{L_2 + L_3 - 2k_{23}\sqrt{L_2 L_3}}$$

Where $L_{nom}$ is the nominal inductance of the $L_1$–$L_2$ path, with $L_3$ open-circuited. $L_{nom}=L_1+L_2+2k_{12}\sqrt{L_1 L_2}$.

Figure 4D:
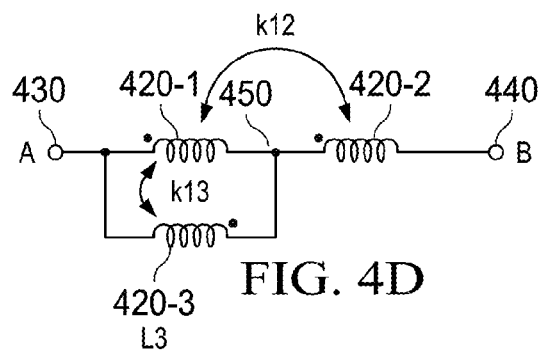

FIG. 4D discloses the equivalent circuit of variable-inductance network 400 when first select switch 410-1 is closed and second select switch 410-2 is closed. In this case, first inductor 420-1 and third inductor 420-3 are parallel to each other and in series with second inductor 420-2. In this case, the total inductance of the network can be described with the following equation:

$$L_{eq2} = L_{nom} - \frac{(L_1 + k_{12}\sqrt{L_1 L_2} + k_{13}\sqrt{L_1 L_3} + k_{23}\sqrt{L_2 L_3})^2}{L_1 + L_3 + 2k_{23}\sqrt{L_1 L_3}}$$

From these equations, an inductor geometry can be developed based on desired $L_1$, $L_2$ and $L_3$, as well as $k_{12}$, $k_{13}$ and $k_{23}$ that will yield three different effective inductance values ($L_{nom}$, $L_{eq1}$ and $L_{eq2}$).

Figure 4E:
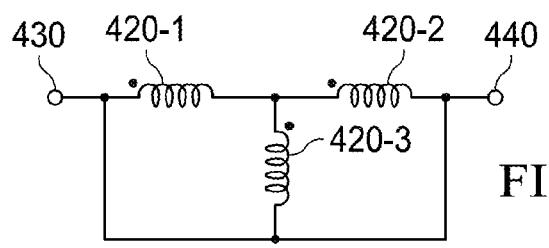

FIG. 4E discloses the equivalent circuit of variable-inductance network 400 when both select switches 410 are closed. In this case, the inductors are completely bypassed, so that the equivalent inductance is zero.

Figure 5:
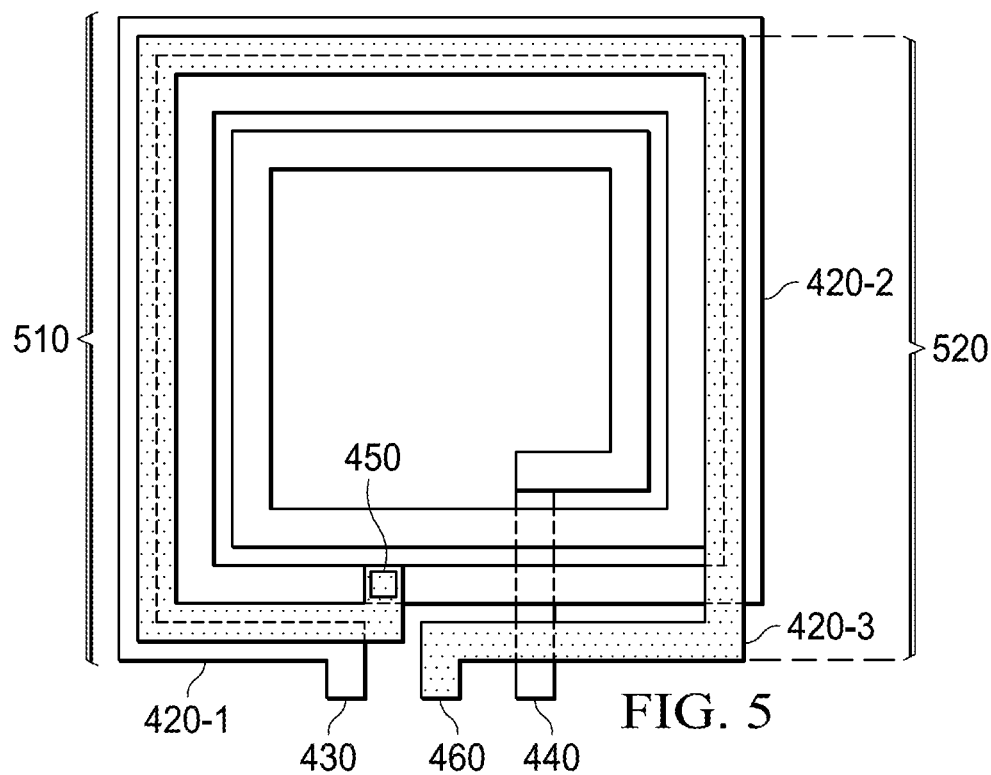
FIG. 5 is a top view of a variable-inductance network suitable for use in an integrated circuit.

FIG. 5 is a top view of an example integrated circuit element 500 implementing variable-inductance network 400 of FIG. 4. Integrated circuit element 500 may be implemented according to techniques known in the art, for example using common silicon-based processes. In this embodiment, two windings are disclosed; first winding 510 forms first inductor 420-1 and second inductor 420-2, while second winding 520 forms third inductor 420-3. In this embodiment, first winding 510 has a plurality of windings, while second winding 520 has a single winding. First winding 510 and second winding 520 may be on separate layers of the inter-metal dielectric so that the windings do not electrically short.

In this embodiment, first winding 510 winds in a clockwise direction, from input node 430 to output node 440. Output node 440 may be formed on a layer separate from the layer for first winding 510 to avoid shorting to first winding 510. This may be the same or a different layer from the layer for second winding 520.

Second winding 520 is formed on a separate layer from the layer for first winding 510, and in this embodiment is substantially concentric with first winding 510. Because it is easier, as a practical matter, to limit second winding 520 to a single winding, the outer diameter of second winding 520 may be substantially wider than that of first winding 510, which will create a larger inductance from a single winding. In that case, however, mutual coupling may be reduced because the two windings are physically further separated from one another. In this embodiment, second winding 520 winds in a counterclockwise direction, from node 460 to intermediate tap 450, which may be formed for example by a via connection between the two layers. It should be recognized that in the example embodiment disclosed in FIG. 5, magnetic coupling between third inductor 420-3 and first inductor 420-1 will be stronger than magnetic coupling between third inductor 420-3 and second inductor 420-2. This is because in this embodiment, second winding 520 follows the outer portion of first winding 510 more closely than the inner portion. Under a different design, however, where it is more desirable to strongly magnetically couple second inductor 420-2 to third inductor 420-3, second winding 520 can be wound more tightly around the inner portion of first winding 510.

Note that some capacitive coupling along with other forms of undesirable parasitics may occur between first winding 510 and second winding 520. In some embodiments, additional design work may be required to compensate for such parasitics.

In some embodiments, integrated circuit element 500 may be only one piece of a much larger integrated circuit, including both analog and digital components, such as integrated circuit 100. Because analog components are relatively large, it is desirable to minimize the number of analog piece parts. Thus, for example, it may be desirable when building a network of selectable inductances to build a compact integrated circuit element such as integrated circuit element 500, rather than three separately-switched inductors for each variable inductor L of FIG. 2.

In one example embodiment, a fifth-order low-pass filter is constructed according to the schematic of FIG. 2, using the variable capacitors of FIG. 3 and the variable inductors of FIG. 4. In this example, a binary code is used to select between three pass bands as follows:

| Cutoff Frequency | Mode | Capacitor Vsel | Inductor Vsel |
|---|---|---|---|
| Bypass | 0 | 000 | 11 |
| 500 MHz | 1 | 001 | 10 |
| 300 MHz | 2 | 011 | 01 |
| 225 MHz | 3 | 111 | 00 |

In this example, capacitor networks are selected according to a monotonic Gray code, and one inductance mode is mapped to each capacitance mode. A bypass mode is provided when all capacitor select switches are open, and both inductor select switches are closed. Appropriate capacitance and inductance values for each capacitor 320 and each inductor 420 may be selected to achieve these example passbands. For example, a fifth-order Chebyshev low-pass filter with 0.25 dB ripple in a 100-ohm system can be constructed with Y1=10 pF, Z2=93 nH, Y3=16 pF, Z4=93 nH, and Y5=10 pF, where "Zn" and "Yn" represent the five reactive impedance and susceptive admittance elements, respectively, of a classical Chebyshev filter. Y1, Y3, and Y5 are capacitances in this embodiment, while Z2 and Z4 are inductances. This provides a cutoff frequency at 225 MHz with a rolloff of approximately −100 dB dB/decade.

The foregoing features several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In the discussions of the embodiments above, any of the capacitors, buffers, graphics elements, interconnect boards, clocks, sensors, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, non-transitory software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In another example embodiment, the electrical circuits of the FIGURES may be implemented as stand-alone modules (e.g., a device with associated components and circuitry configured to perform a specific application or function) or implemented as plug-in modules into application specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

What is claimed is:

1. A programmable filter, comprising:
a first resonant element network comprising a variable-inductance network comprising:
a first conductive winding on a first layer in a first direction, the first winding having an intermediate tap;
a second conductive winding on a second layer in a second direction, a terminal of the second winding being electrically connected to the intermediate tap; and
a selector for selecting an active side of the intermediate tap; and
a second element resonant network having a resonant frequency with the first resonant network;
wherein a passband is selectable by selecting an inductance to influence the resonant frequency.

2. The programmable filter of claim 1, wherein the variable-inductance network comprises:
a first inductor having a first terminal and a second terminal;
a second inductor having a first terminal and a second terminal, the second terminal of the first inductor and first terminal of the second inductor joined at an intermediate tap;
a third inductor having a first terminal joined at the intermediate tap, and a second terminal; and
an inductance switch connected between the second terminal of the third inductor and the first terminal of the first inductor;
whereby a first inductance is selectable by closing the switch and a second inductance is selectable by opening the switch.

3. The programmable filter of claim 2, wherein the variable-inductance network further comprises a second inductance switch connected between the second terminal of the third inductor and the second terminal of the second inductor, whereby a third inductance is selectable by closing only the second inductance switch, and a fourth inductance is selectable by closing both inductance switches.

4. The programmable filter of claim 1,
wherein the second resonant element network is a variable-capacitance network comprising a plurality of capacitors and a capacitance switch for selecting between at least two capacitances;
wherein the passband is further selectable by selecting a capacitance.

5. The programmable filter of claim 4, wherein the variable-capacitance network comprises:
three variable capacitor stages, each variable capacitor stage comprising:
a first capacitor and capacitance switch in parallel with a second capacitor and capacitance switch, the capacitance switches paired to one another;
whereby a capacitance is selectable by closing the capacitance switches according to a monotonic Gray code.

6. The programmable filter of claim 1, wherein the first winding and second winding are substantially concentric with each other.

7. The programmable filter of claim 1, wherein the second winding has only a single winding.

8. The programmable filter of claim 1, wherein the second winding has only a single winding.

9. The programmable filter of claim 1, wherein the second direction is opposite to the first direction.

10. The programmable filter of claim 1, wherein
the first winding is a primary inductor;
the second winding is a secondary inductor; and
the selector comprises a first switch and second switch.

11. The programmable filter of claim 1, wherein the second direction is opposite the first direction, wherein closing the first switch creates a negative mutual inductance with the primary inductor and closing the second switch creates a positive mutual inductance with the primary inductor.

12. The programmable filter of claim 4, wherein the capacitance network is a first capacitance network, wherein the programmable filter is implemented on an integrated circuit, and further comprising:
- a second and third variable-capacitance network, each variable capacitance network having a first and second terminal;
- a second, third, and fourth variable-inductance network, each variable-inductance network having a first and second terminal;

wherein:
- the first terminal of the first variable capacitance network is connected to the first terminal of the first variable inductance network, and the second terminal of the first variable capacitance network is connected to the first terminal of the second variable inductance network;
- the first terminal of the second variable capacitance network is connected to the second terminal of the first variable inductance network and the first terminal of the third variable inductance network, and the second terminal of the second variable capacitance network is connected to the second terminal of the second variable inductance network and the first terminal of the fourth variable inductance network; and
- the first terminal of the third variable capacitance network is connected to the second terminal of the third variable inductance network and the second terminal of the fourth variable inductance network.

13. An integrated circuit, comprising:
- a programmable low-pass filter having a selectable passband, comprising:
  - a first resonant element network comprising a variable-inductance network comprising a first conductive winding on a first layer in a first direction, the first winding having an intermediate tap; a second conductive winding on a second layer in a second direction, a terminal of the second winding being electrically connected to the intermediate tap; and a selector for selecting an active side of the intermediate tap; and
  - a second resonant element network having a resonant frequency with the first resonant element network;
  - wherein a passband is selectable by selecting an inductance via the selector.

14. The integrated circuit of claim 13, wherein the low-pass filter further comprises a variable-capacitance network comprising a plurality of capacitors and a capacitance switch for selecting between at least two capacitances; and wherein the passband is further selectable by selecting an capacitance.

15. The integrated circuit of claim 14, wherein the variable-capacitance network comprises:
- three variable capacitor stages, each variable capacitor stage comprising:
  - a first capacitor and capacitance switch in parallel with a second capacitor and capacitance switch, the capacitance switches paired to one another;
  - whereby a capacitance is selectable by closing the capacitance switches according to a monotonic Gray code.

16. The integrated circuit of claim 13, wherein the variable-inductance network comprises:
- a first inductor having a first terminal and a second terminal;
- a second inductor having a first terminal and a second terminal, the second terminal of the first inductor and first terminal of the second inductor joined at an intermediate tap;
- a third inductor having a first terminal joined at the intermediate tap, and a second terminal; and
- wherein the selector comprises an inductance switch connected between the second terminal of the third inductor and the first terminal of the first inductor;
- whereby a first inductance is selectable by closing the switch and a second inductance is selectable by opening the switch.

17. The integrated circuit of claim 16, wherein the variable-inductance network further comprises a second inductance switch connected between the second terminal of the third inductor and the second terminal of the second inductor, whereby a third inductance is selectable by closing only the second inductance switch, and a fourth inductance is selectable by closing both inductance switches.

18. The apparatus of claim 17, wherein the capacitance network has a selectable capacitance, selectable according to a monotonic Gray code.

19. An apparatus, comprising:
- an inductance network having a selectable inductance L, comprising a first conductive winding on a first layer in a first direction, the first winding having an intermediate tap; a second conductive winding on a second layer in a second direction, a terminal of the second winding being electrically connected to the intermediate tap; and a selector for selecting an active side of the intermediate tap; and;
- a capacitance network having a capacitance C;
- wherein the apparatus is operable to provide a selectable passband based on L and C.

* * * * *